(12) United States Patent
Kim et al.

(10) Patent No.: US 6,312,990 B1
(45) Date of Patent: Nov. 6, 2001

(54) STRUCTURE NONVOLATILE SEMICONDUCTOR MEMORY CELL ARRAY AND METHOD FOR FABRICATING SAME

(75) Inventors: Keon-Soo Kim; Jeong-Hyuk Choi, both of Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/644,250

(22) Filed: Aug. 22, 2000

Related U.S. Application Data

(62) Division of application No. 09/132,685, filed on Aug. 12, 1998, now Pat. No. 6,130,838.

(30) Foreign Application Priority Data

Aug. 12, 1997 (KR) .................................................. 97-38429

(51) Int. Cl.[7] .................................................. H01L 21/336
(52) U.S. Cl. ..................... 438/257; 438/211; 438/213; 438/225; 438/262; 438/263; 438/279; 438/524
(58) Field of Search .................................. 438/225, 257, 438/439, 449, 211, 213, 274, 524, 262, 263

(56) References Cited

U.S. PATENT DOCUMENTS

| | | | |
|---|---|---|---|
| 5,638,327 | * 6/1997 | Dallabora et al. | 365/185.33 |
| 5,780,890 | * 7/1998 | Hazama | 257/316 |
| 5,899,717 | * 5/1999 | Jun | 438/262 |

OTHER PUBLICATIONS

Satyen Mukherjee et al., "A Single Transistor EEPROM Cell and Its Implementation in a 512K CMOS EEPROM," EDM, pp. 616–619, 1995.

* cited by examiner

*Primary Examiner*—Matthew Smith
*Assistant Examiner*—Craig P. Lytle
(74) *Attorney, Agent, or Firm*—Marger Johnson & McCollom, P.C.

(57) ABSTRACT

A nonvolatile semiconductor memory cell array is shown which is composed of a plurality of unit cell-arrays arranged in a repeating pattern. Each of the unit cell-arrays includes a first plurality of cell transistors having control gates coupled in common to a first word line and a second plurality of cell transistors having control gates coupled in common to a second word line. The two word lines are arranged in parallel to one another and perpendicular to a bit line. The bit line is connected in common with drains of both the first and second plurality of cell transistors through a bit line contact. A pair of source lines is arranged along each side of the bit line and parallel to the bit line. Each source line is coupled to one transistor from each of the first and second pluralities of cell transistors through a source line contact.

18 Claims, 12 Drawing Sheets

STRUCTURE NONVOLATILE SEMICONDUCTOR MEMORY CELL ARRAY AND METHOD FOR FABRICATING SAME

This application is a Division of Ser. No. 09/132,685 filed Aug. 12, 1998, U.S. Pat. No. 6,130,838.

BACKGROUND OF THE INVENTION

1. Field of the Invention

The present invention concerns a nonvolatle semiconductor memory and, more particularly, the structure of a NOR-type flash electrically erasable and programmable read-only memory (EEPROM).

2. Description of the Related Art

Nonvolable semiconductor memory is typically used in applications for Mask ROM, EPROM, EEPROM, flash EEPROM, etc. Flash EEPROM features immediate electrical erasure of data and low power consumption and, therefore, is typically used as a permanent memory in devices such as a notebook computer or a memory card for a digital camera.

The logical state of the data stored in a nonvolatile semiconductor memory cell is determined by the threshold voltage of the cell transistor. The threshold voltage is defined as the voltage required between the control gate and the source of the cell transistor in order to turn on the transistor. Each cell transistor of an EPROM, EEPROM or flash EEPROM has a floating gate that is isolated from the control gate. The threshold voltage of each cell transistor varies with the amount of charge stored on the floating gate. Thus, data is stored or programmed by increasing or decreasing the amount of charge on the floating gate.

In order to read out data from a programmed cell, the decoder circuit is employed to apply a voltage signal to the cell and the related circuit in order to obtain a current or voltage signal on a bit line for the cell. The current or voltage signal on the bit line represents the data stored in the cell. A sense amplifier connected to the bit line is used to detect the current or voltage signal and identify the data as a logical "1" or "0".

The structure of the memory cell array is largely classified into NOR-type and NAND-type according to the manner in which the memory cells are connected to the bit lines. A NOR-type structure has each memory cell connected between the bit line and the source line. A NAND-type structure has a string of memory cells connected in series between the bit line and a ground line.

The NOR-type structure is inferior to the NAND-type in view of the scale of integration that can be achieved. However, the NOR-type structure obtains higher operational speed due to higher cell current. Consequently, the NOR-type structure has tended to supplant the NAND-type and the focus of development has been on seeking improvement of the scale of integration of the NOR-type cell transistors.

An example of a NOR-type flash EEPROM is disclosed in an article entitled "A Single Transistor EEPROM Cell and Its Implementation in a 512K CMOS EEPROM" authored by Satyen Mukherjee et al, IEDM, pp. 616–619, 1985. This structure has each bit line commonly connected with two cell transistors. The source region of each of the two cell transistors is extended and connected with a common source line. This requires a bit line contact for the two cell transistors which limit the scale of integration that can be achieved.

In addition, electrical resistance increases with the length of the source region that is extended to the common source line. The increased source resistance of the cell transistors can cause a read or program operation on the cell to fail. Such an operational failure can be prevented by decreasing the interval between the source region and the common source line and by providing a common bit line in place of several bit lines. But the extent of the common source lines makes it difficult to improve the scale of integration of the memory cells.

SUMMARY OF THE INVENTION

It is an object of the present invention to provide a cell array structure for a NOR-type flash EEPROM which has a considerably reduced number of bit lines in order to improve the scale of integration and a method for fabricating such a cell array structure.

It is another object of the present invention to provide a cell array structure for a nonvolatile semiconductor memory having reduced source line resistance which allow for large scale integration of the cell array structure and a method for fabricating such a cell array structure.

It is still another object of the present invention to provide a cell array structure for a NOR-type EEPROM which may considerably reduce the extent of the contacts of all bit lines by making a plurality of cell transistors commonly occupy a single bit line and a method for fabricating such a cell array structure.

It is further another object of the present invention to provide the cell array structure for an EEPROM which has a considerably reduced number of bit lines with an increased number of source lines so as to improve the scale of integration and operational reliability and a method for fabricating such a cell array structure.

It is a further object of the present invention to provide a method for fabricating a memory cell array which may prevent a read or program operation from failing.

An embodiment of a nonvolatile semiconductor memory cell array, according to the present invention, is composed of a plurality of unit cell-arrays, wherein each of said unit cell-arrays includes first and second pluralities of cell transistors, where each cell transistor has a control gate, a drain and a source. First and second word lines are included, wherein the first and second word lines are adjacent one another and wherein the first word line is commonly connected to the control gates of the first plurality of cell transistors and the second word line is commonly connected to the control gates of the second plurality of cell transistors. A bit line is commonly connected to the drains of each of the first and second plurality of cell transistors through a bit line contact. First and second source lines are arranged in parallel to one another alongside the bit line. The first source line is connected to a first one of the first plurality of cell transistors through a first source line contact and the first source line is connected to a first one of the second plurality of cell transistors through a second source line contact The second source line is connected to a first one of the second plurality of cell transistors through a third source line contact and the second source line is connected to a second one of the second plurality of cell transistors through a fourth source line contact.

Another embodiment of a unit cell-array, according to the present invention, includes first, second, third and fourth cell transistors each having a control gate, a floating gate, a source and a drain. A first word line is commonly connected with the control gates of the first and second cell transistors. A second word line is commonly connected with the control gates of the third and fourth cell transistors. A bit line is commonly connected with the drains of the first, second, third and fourth cell transistors through a bit line contact A first source line is arranged in parallel with the bit line and commonly connected with the source of the first cell transistor through a first source line contact and with the source of the third cell transistor through a second source line contact. And a second source line is arranged symmetrically with the first source line about the bit line and commonly connected with the source of the second cell transistor through a third source line contact and with the fourth cell transistor through a fourth source line contact.

An embodiment, according to the present invention, of a NOR-type flash memory cell array is composed of a plurality of unit cell-arrays repeatedly arranged, wherein each of said unit cell-arrays includes first, second, third and fourth cell transistors each having a floating gate, control gate, source and drain. A first word line is commonly connected with the control gates of said first and second cell transistors and a second word line is commonly connected with the control gates of said third and fourth cell transistors. A source line is arranged perpendicularly to the word lines and is commonly connected with the sources of the first and second transistors through one source line contact and with the sources of said third and fourth transistors through another source line contact. A first bit line is arranged in parallel with said source line and connected with the drains of said first and third cell transistors through one bit line contact and a second bit line is arranged symmetrically with said first bit line about said source line and is connected with the drains of said second and fourth cell transistors through another bit line contact.

An embodiment of a method, according to the present invention, for fabricating a nonvolatile semiconductor memory cell array having a plurality of unit cell-arrays repeatedly arranged, each of said unit cell-arrays including two adjacent word lines each commonly occupied by control gates of a plurality of cell transistors, a bit line connected with drains of the four adjacent cell transistors of both word lines through a bit line contact, a pair of source lines respectively arranged in parallel at both sides of said bit line, and sources of the two adjacent cell transistors of each of both word lines respectively connected with different ones of said source lines through different source line contacts, includes forming a stack gate structure of each of the plurality of cell transistors by stacking a floating gate and one of the word lines over an active region between a pair from a plurality of field oxide layers on a semiconductor substrate, said floating gate and word line being surrounded by insulating layers. The method then calls for exposing alternate ones of said plurality of field oxide layers in order to remove the exposed oxide layers. The method also includes implanting impurity ions for the drain and source of each one of the plurality of cell transistors into the regions cleared of said exposed oxide layers in order to obtain the bit and source line contacts. Further, the method requires applying an intermediate insulating layer to an upper surface of said substrate and etching said intermediate insulating layer to expose the ion-implanted regions so as to form the bit and source line contact holes. Finally, the method includes performing metallization to obtain the bit and source lines.

An embodiment of a method, according to the present invention, for fabricating a nonvolabe memory cell array includes forming a plurality of field oxide layers so as to isolate active regions defined in a semiconductor substrate, sequentially depositing a tunnel oxide layer and a first silicon layer for floating gates over said semiconductor substrate, and partially etching said first silicon layer and tunnel oxide layer to expose parts of said field oxide layers. The method also includes sequentially depositing an insulating layer and a second silicon layer for the word lines over said substrate to make a pattern of the word lines parallel with each other and perpendicular to said active regions and etching said second silicon layer, insulating layer and first silicon layer except said word line pattern to form said floating gates and word lines. The method further requires forming an alternate etching pattern to alternately expose said field oxide layers between said word lines and said active regions and removing the exposed field oxide layers to implant impurity ions for the drain and sources by using said alternate etching pattern and said word lines as a mask. The method then calls for applying an intermediate insulating layer to the whole upper surface of said substrate, partially etching said intermediate insulating layer so as to expose the ion-implanted regions so as to simultaneously form the bit line and source line contact holes, and forming metal lines over said intermediate insulating layer so as to contact said drain and source regions through said contact holes, whereby the drain regions of the adjacent cell transistors of the adjacent word lines are commonly connected with a bit line and the source regions of the adjacent cell transistors of each of said adjacent word lines are separately connected with different source lines.

An embodiment of a method, according to the present invention, for fabricating a NOR-type memory cell array includes forming a plurality of field oxide layers so as to isolate active regions defined in a semiconductor substrate, sequentially depositing a tunnel oxide layer and a first silicon layer for floating gates over said semiconductor substrate, and partially etching said first silicon layer and tunnel oxide layer to expose parts of said field oxide layers. The method then calls for sequentially depositing a composite insulating layer, to serve as a gate insulator, and a second silicon layer, to serve both word lines and control gates, over said substrate to form a pattern where the word lines are parallel with each other and perpendicular to said active regions and etching said second silicon layer, composite insulating layer and first silicon layer except said word line pattern in order to form said floating gates and word lines. The method also includes forming an alternate etching pattern to alternately expose said field oxide layers between said word lines and said active regions and removing the exposed field oxide layers and implanting impurity ions to form drains and sources by using said alternate etching pattern and said word lines as a mask. Then the method requires applying an intermediate insulating layer to an upper surface of said substrate, partially etching said intermediate insulating layer so as to expose the ion implanted regions so as to simultaneously from bit line contact holes and source line contact holes, and forming metal lines over said intermediate insulating layer so as to contact said drain and source regions through said contact holes, whereby every bit line has a bit line contact hole for commonly connecting four drain regions and the source line parallel to the bit line has two source line contact holes each commonly connecting to two source regions.

An embodiment of an electrically programmable non-volatile memory, according to the present invention, is composed of a plurality of unit cell-arrays repeatedly arranged, wherein each of said unit cell-arrays includes first and second pluralities of adjacent cell transistors, each one of the first plurality of cell transistors having a control gate, source and drain. A first word line commonly is connected to the control gates of the first plurality of cell transistors. A second word line is commonly connected to the control gates of the second plurality of cell transistors. A bit line is commonly connected to the drains of the first and second pluralities of cell transistors through a bit line contact And first and second source lines are arranged in parallel along each side of the bit line. The first source line is connected to the source of a first one of the first plurality of cell transistors through a first source contact and connected to the source of a first one of the second plurality of cell transistors through a second source contact The second source line is connected to the source of a second one of the first plurality of cell transistors through a third source contact and connected to the source of a second one of the second plurality of cell transistors through a fourth source contact. Each one of the cell transistors is configured to be programmed by providing the bit line with a programming voltage higher than a voltage applied to a corresponding one of the first and second source lines. Each one of the cell transistors is also configured to be programmed by providing the corresponding one of the first and second source lines with a read voltage that is higher than the voltage applied to the bit line.

And an embodiment of a method for forming an electrically erasable memory cell array, according to the present invention, includes forming a first plurality of cell transistors, each one of the first plurality of cell transistors having a control gate, floating gate, source and drain, where the first plurality of cell transistors is disposed linearly along a first line and forming a second plurality of cell transistors, each one of the second plurality of cell transistors having a control gate, floating gate, source and drain, where the second plurality of cell transistors is disposed linearly along a second line that is parallel to the first line. The method then sets forth forming a first word line along the first line and coupling the first word line to the control gate of each one of the first plurality of cell transistors and forming a second word line along the second line and coupling the second word line to the control gate of each one of the second plurality of cell transistors. A bit line is then formed perpendicular to the first and second word lines and the bit line is coupled to the drains of each cell transistor of the first and second pluralities of cell transistors. The method also requires forming a first source line adjacent to a first side of the bit line and coupling the first source line to the source of one cell transistor of the first plurality of cell transistors through a first source contact and coupling the first source line to the source of one cell transistor of the second plurality of cell transistors through a second source contact The method then calls for forming a second source line adjacent to a second side of the bit line and coupling the second source line to the source of another cell transistor of the second plurality of cell transistors through a third source contact and coupling the second source line to the source of another cell transistor of the second plurality of cell transistors through a fourth source contact The present invention considerably reduces the number of bit lines while increasing the number of source lines so that the size of the cell array is reduced to improve the degree of integration and source resistance is reduced to enhance the operational reliability.

The present invention will now be described more specifically with reference to the drawings attached only by way of example, wherein the elements having like functions are represented by like reference numerals or symbols for convenience's sake.

DETAILED DESCRIPTION OF THE PREFERRED EMBODIMENT

Figure 1:
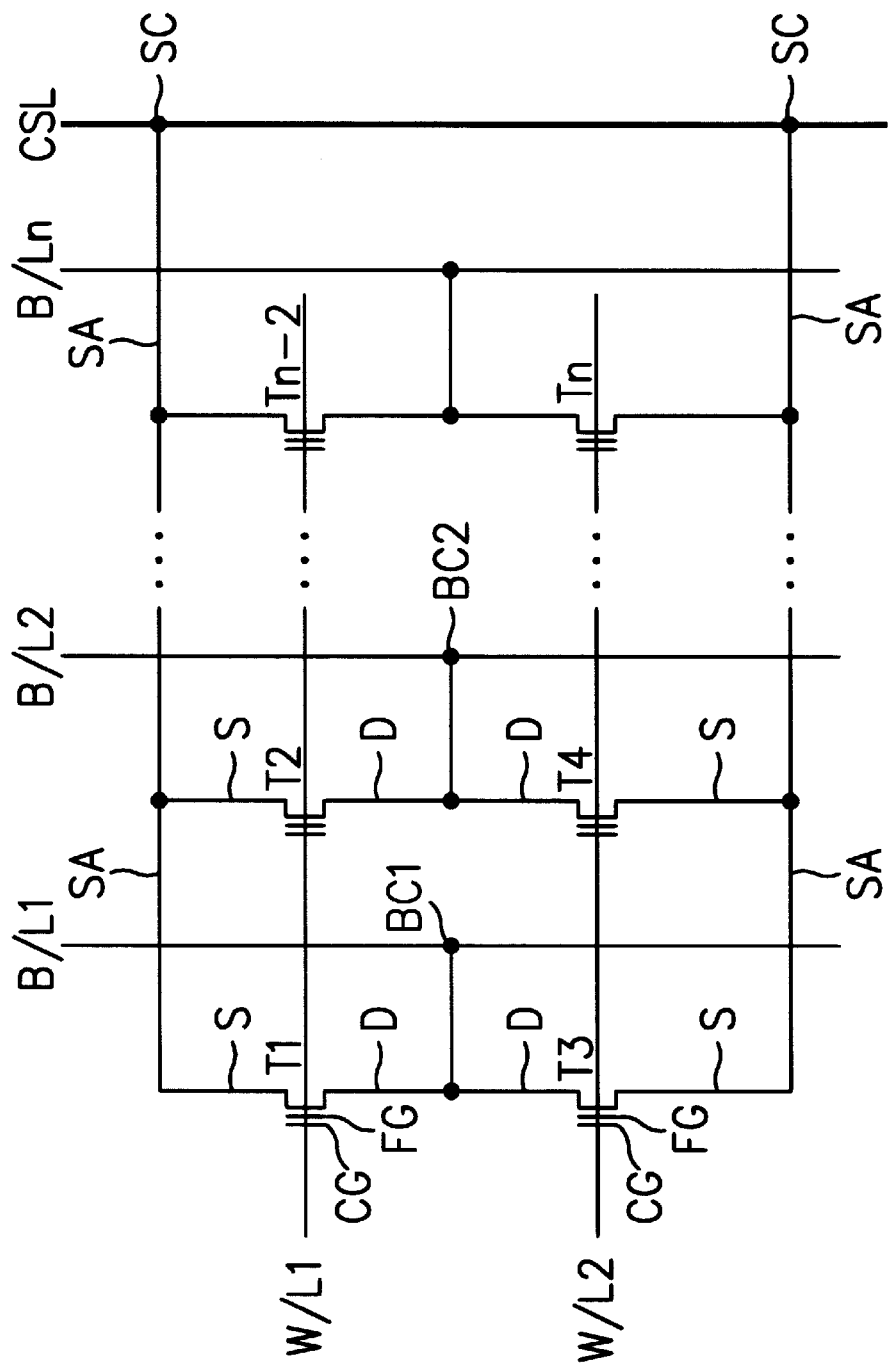
FIG. 1 is a circuit diagram illustrating the structure of a conventional NOR-type cell array.

Referring to FIG. 1, a conventional NOR-type cell array is shown. Each of cell transistors T1–Tn generally includes a drain D, source S, floating gate FG, and control gate CG. Each control gate CG is formed integrally with a word line W/L1 or W/L2 and stacked over a floating gate FG with an insulating layer between them. The cell transistors are connected where metal bit lines B/L1–B/Ln intersect with the polysilicon word lines W/L1 orW/L2, so as to form a matrix.

The control gates CG of cell transistors T1 and T3 are connected with two adjacent word lines W/L1 and W/L2, respectively. The common drains D of transistors T1 and T3 are formed by a common active region which is connected to bit line B/L1 through a bit line contact BC1. Likewise, the control gates CG of cell transistors T2 and T4 are connected with two adjacent word lines W/L1 and W/L2, respectively. The common drains D of transistors T2 and T4 are formed by a common active region which is connected to bit line B/L2 through a bit line contact BC2.

Namely, each pair of cell transistors is connected with a metal bit line through a bit line contact The word lines W/L1 and W/L2 are arranged perpendicular to the bit lines B/L1–BLn.

Meanwhile, the sources S of the cell transistors T1–Tn are connected with source line contacts SC through source active regions SA of the cell transistors which are parallel with the word lines W/L1 and W/L2. The source line contacts SC are connected with the common source line CSL. The source S and source active region SA are formed from the same active region, which is obtained from the pattern used in processing to an impurity diffused region. Thus, in such a conventional memory cell array, it should be noted that the cell transistors T1–Tn are connected to their respective word lines W/L1 and W/L2 through their control gates CG, to their respective bit lines B/L1-n through their drains D, and their sources S are connected to a common source line. This requires that the drain active region D of each cell transistor be connected to bit line B/L1-n through a bit line contact BC1-n which limits the degree to which chip size can be reduced.

Moreover, the electrical resistance of the source active region SA of each cell transistor T1-n is increased with the increase in length from the sources S of each cell transistor to the common source line CSL which frequently results in errors in data reading or programming operations. To describe how these operational errors arise, it is first assumed that a cell transistor T1-n stores data as a logical "1" or "0" according to the level of charge on the floating gate FG of each transistor. The programming operation changes the state of the cell transistor from data "0" to "1". Programming is achieved by applying a voltage to the cell transistor so as to increase its threshold voltage from about 2V to about 7V. To this end, a voltage of about 5V to 6V is applied to the selected bit line B/L1-n, a voltage of about 10V to 12V is applied to the selected word line W/L1 or W/L2, and a voltage of 0V is applied to the source and bulk of the transistor being programmed.

The selected cell transistor T1-n is turned on such that current flows from the drain D to the source S of the transistor. This produces hot electrons, some of which gain sufficient energy in order to cross the potential barrier of the gate oxide layer and hence charge the floating gate FG. This is called "tunnel effect". The threshold voltage of the cell transistor is thus raised from the initial voltage level of 2V to the programmed voltage level of 7V. The electrons are permanently stored on the floating gate FG until an erasure operation is performed because of the excellent insulation of the gate oxide layer surrounding the floating gate FG and the triple insulator structure O/N/O of the floating gate.

The erasure operation returns the threshold voltage to its initial value 2V by discharging the electrons from the floating gate FG. To this end, the voltage of the bit line B/L1-n of the selected cell transistor T1-n is allowed to float while a voltage of about 12V to 15V is applied to the common source line CSL and a voltage of 0V is applied to the respective word line W/L1–2. This causes a voltage difference between the floating gate FG and the source S junction of the transistor in order to induce the tunnel effect through the thin oxide layer, which has a thickness of about 100 Å. This is called F-N tunneling wherein the electrons isolated in the floating gate FG are discharged to the source region S. This lowers the threshold voltage of the cell transistor to the initial value 2V.

When reading the stored data of a cell transistor T1-n, a voltage of about 1V is applied to the bit line B/L1-n for the selected transistor and a voltage of about 4V to 5V is applied to the word line W/L1–2 in order to form a current path in the selected transistor.

However, in the cell array structure shown in FIG. 1, a cell transistor may not be programmed normally owing to an increased source bias when applying a programming voltage. The source active region SA of the cell transistor has too large a resistance for normal programming due to the increased length required in order to connect the source active region SA with the common source line CSL Accordingly, the source bias voltage rises to greater than 0V which reduces the voltage difference between the source S and the drain D. This decreases the number of the hot carriers tunneling into the floating gate FG and the threshold voltage of the cell transistor remains lower than it would be if programming proceeded normally. Thus, normal programming is easily frustrated and reduces the reliability of the data stored. Moreover, the state of the stored data may be disturbed because the voltage on the bit line B/L1-n voltage can cause hot electrons to be trapped in the tunnel oxide layer or unintentionally stored on the floating gate FG.

In order to resolve such programming and reading errors, a memory array structure has been proposed which requires a source line for every 8 or 16 cell transistors and limits the number of the cell transistors programmed to 4 to 8. This reduces the distance between the source S of each cell transistor and the common source line CSL Nevertheless, this approach does not decrease the number of bit lines and has an inherent limitation in terms of large scale integration owing to the increased number of the source lines arranged for every few bit lines. Namely, the area occupied by the source lines makes it more difficult to obtain better large scale integration than the array structure shown in FIG. 1.

Figure 2:
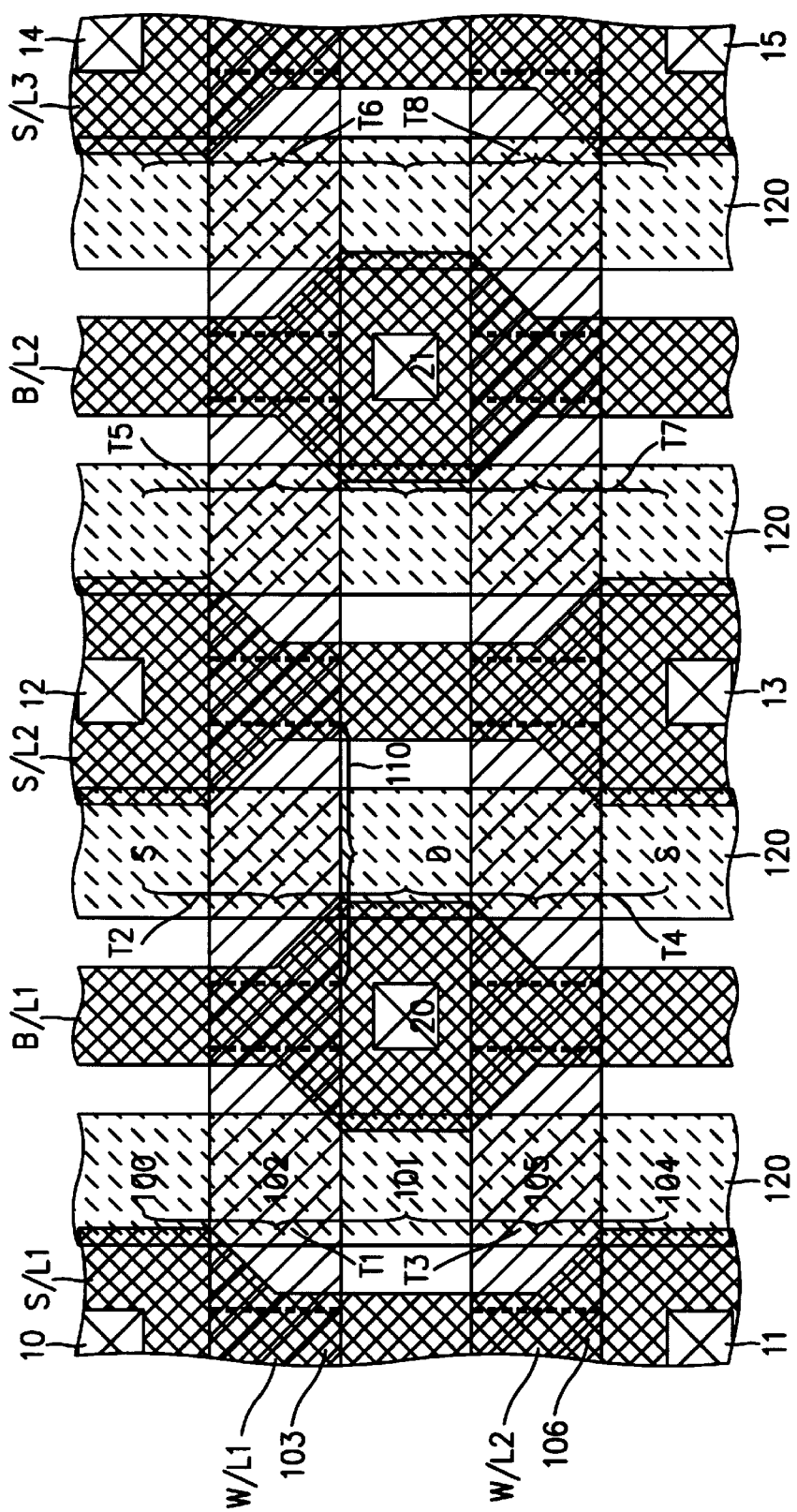
FIG. 2 is a layout illustrating the structure of a NOR-type cell array according to an embodiment of the present invention.
Figure 3:
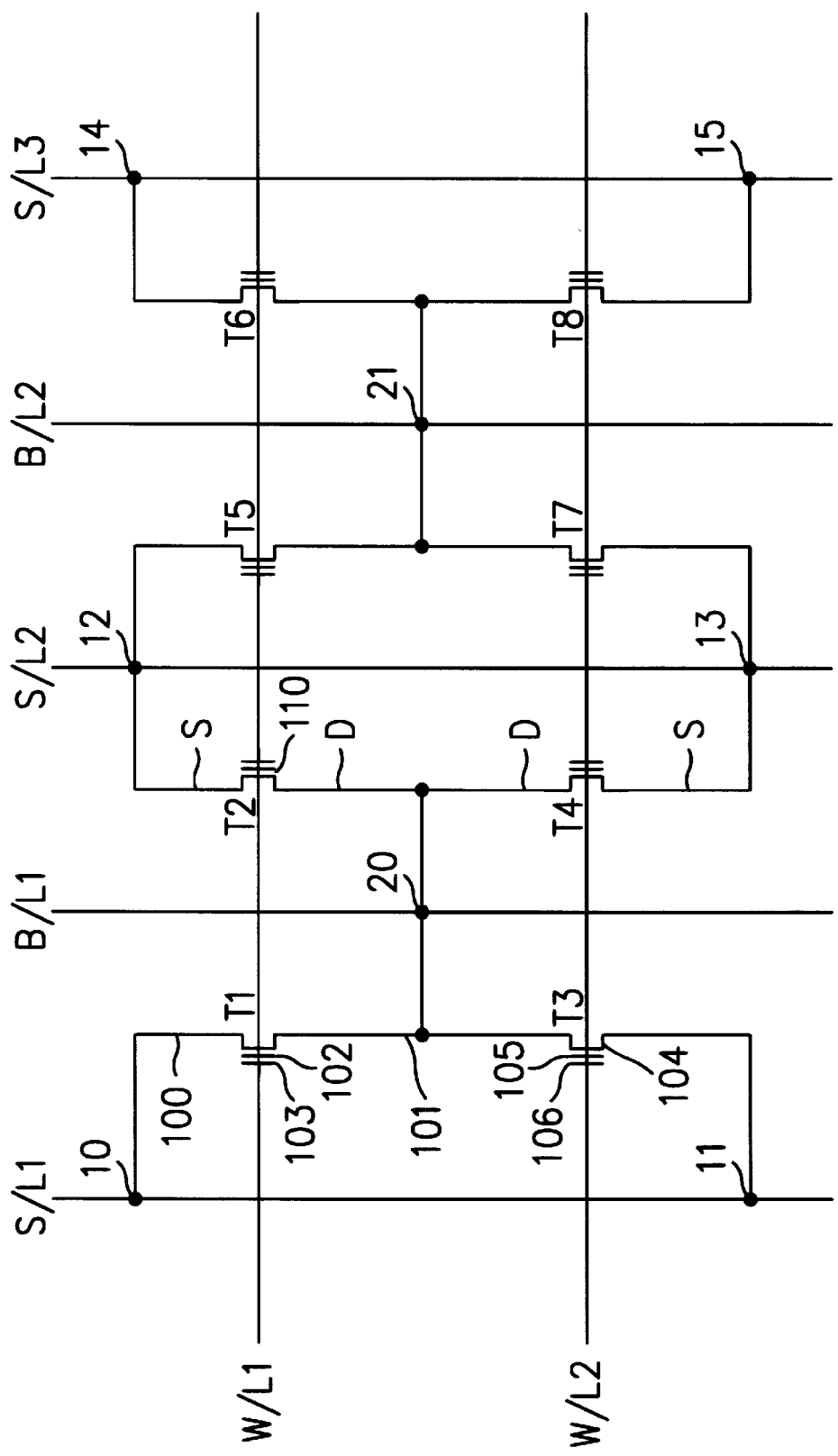
FIG. 3 is an equivalent circuit diagram of the layout structure of FIG. 2.

The problems of the conventional structure are resolved in the structure of the present invention shown in FIGS. 2 and 3. In FIGS. 2 and 3, the source lines are labeled S/L1, S/L2, and S/L3 and the bit lines are labeled B/L1 and B/L2. Similarly, the source line contacts are labeled 10, 11, 12, 13, 14 and 15, and the bit line contacts are labeled 20 and 21. The cell transistors T1 and T8 are separately arranged in parallel active regions labeled 118.

According to the present invention, the memory cell array includes a plurality of unit cell-arrays as shown in the embodiment of the present invention shown in FIGS. 2 and 3. Each unit cell-array includes two adjacent word lines W/L1 and W/L2 which are commonly coupled to the control gates of a plurality of cell transistors T1 and T2 and transistors T3 and T4, respectively. A bit line B/L1 is connected in common with the drains D of the four adjacent cell transistors T1, T2, T3, T4 within the region 101 through a common bit line contact 20.

A pair of source lines S/L1 and S/L2 are arranged in parallel adjacent both sides of the bit line B/L1 and are connected to the source regions of transistors T1 and T3 and transistors T2 and T4, respectively. For instance, the source line S/L1 is connected to the source region 100 of transistor T1 through source line contact 10 and connected to the source region 104 of transistor T3 through source line contact 11. Source line S/L2 is similarly connected to the sources of transistors T2 and T4 through source line contacts 12 and 13, respectively.

In other words, the four adjacent cell transistors T1, T2, T3, T4 of the two adjacent word lines W/L1 and W/L2 have drain regions commonly connected with a single bit line B/L1 through a single bit line contact 20. Meanwhile, the sources are connected with two source lines S/L1 and S/L2 arranged parallel to both side of the bit line B/L1 through four different source contacts 10, 11, 12, 13, as shown in FIGS. 2 and 3. This reduces the number of bit lines by half as compared to the conventional structure as shown in FIG. 1. This also considerably improves the degree of integration that can be achieved despite the fact that the number of source lines has increased in order to reduce the source resistance and eliminate the errors which may occur in the programming and reading operation.

To summarize, while the conventional cell array includes a bit line for every cell and a separate source line for every few bit lines, the present invention provides a bit line for each adjacent two cells and connects the source regions of the adjacent cells, connected to the same word line, to different source lines. The number of bit lines is therefore reduced by half. Moreover, the conventional source active region SA is eliminated in order to reduce the size of the cell array as well as the source resistance while increasing the number of source lines to resolve the problems caused by the increase of the source resistance with the length of the source line. This ensures the programming operation and prevents hot carriers from being produced during the reading operation, thus enhancing operational reliability as well as reducing the chip size.

Each operational mode of the cell array shown in FIGS. 2 and 3 will now be discussed. First, the erasure operation starts with applying the erasure voltage of about 5V to the bulk and about −10V to a selected word line so that all of the cells belonging to the selected word line having electrons stored in the floating gate are simultaneously erased. Specifically, the applied voltages form a potential difference between the bulk silicon and the floating gates of the selected cells so as to cause the electrons stored in the floating gates to tunnel through the tunnel oxide layer to the bulk silicon. This reduces the threshold voltage of the erased cells to the initial voltage of about 2V.

Conversely, a cell transistor, such as transistor T1, is programmed by applying about 10V to the word line W/L1 and about 6V to the bit line B/L1. This turns on the cell transistor T1 in order to generate hot electrons which tunnel toward the floating gate 102. The programmed cell transistor T1 has a threshold voltage of about 7V. Meanwhile, it is necessary to keep the corresponding source line S/L1 at 0V while the voltage level of the other source lines S/L2 and S/L3 floats. This is done to prevent the adjacent unselected cell T2 that is commonly connected with the same bit line from being programmed. As shown in FIGS. 2 and 3, the corresponding source line S/L1 is arranged adjacent to the source region 100 of the cell T1, which is different from the conventional case, so that the problems caused by increased source resistance are inherently resolved.

The programmed cell transistor T1 is read by applying about 1V to the bit line B/L1, about 0V to the source line S/L1 and about 5V to the word line W/L1. In this case, the threshold voltage of the cell transistor T1 is about 7V and the sense amplifier connected to the bit line B/L1 therefore detects no current, which corresponds to data having a logical "1" state.

Conversely, if the cell transistor T1 has a threshold voltage of about 2V after completing the programming operation, then the cell has been programmed to store data having a logical "0" state. In this case, the sense amplifier detects some current of a given level flowing through the bit line B/L1, which corresponds to data having a logical "0" state.

Figure 4:
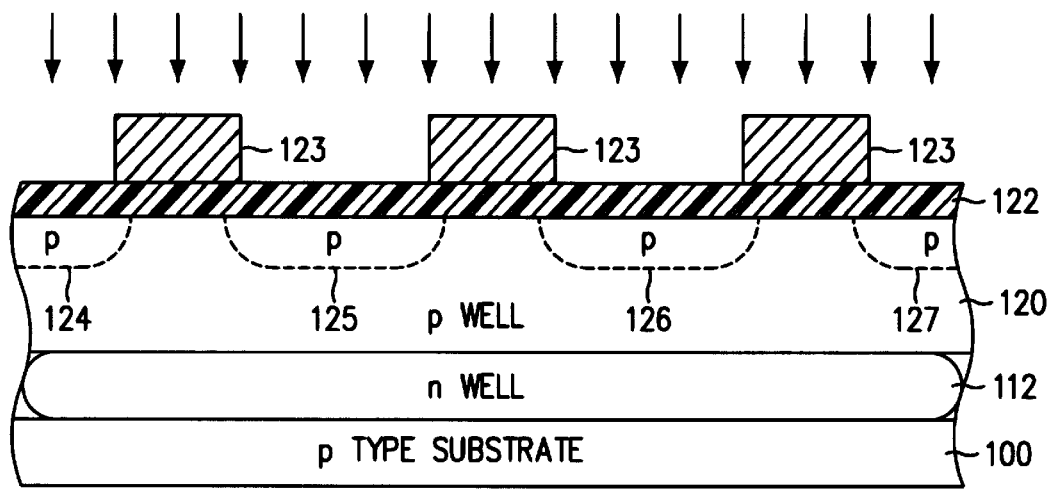
FIGS. 4 to 21 are cross-sectional or planar views illustrating an embodiment of the process according to the present invention for fabricating the memory cell array of FIG. 2.

Referring now to FIG. 4, a p-type substrate 100 having a resistivity of about 18Ω/cm is implanted with phosphorus ions at 1.7E13 ions/cm² with about 150 KeV in order to form n-well 112 by a subsequent diffusion process. The n-well 112 is partly implanted with boron ions at 2.1E13 ions/cm² with about 120 KeV to form pocket p-well 120. Instead of forming the wells 112 and 120, a substrate may be used as the substrate 100 which is p-type. Sequentially applied to the p-type layer 120 are a pad oxide layer 122 and nitride layer 123, which are photographically patterned using a photoresist and etched as shown in FIG. 4. After removing the remaining photoresist from the nitride layer 123, boron ions are implanted into the p-type layer 120 at 5.0E13 ions/cm² with about 30 KeV using the nitride layer 123 as a mask. This is an additional step to adjust the threshold voltage of the field region of the cell transistor and enhance the insulation between elements before forming the field oxide layer.

Figure 5:
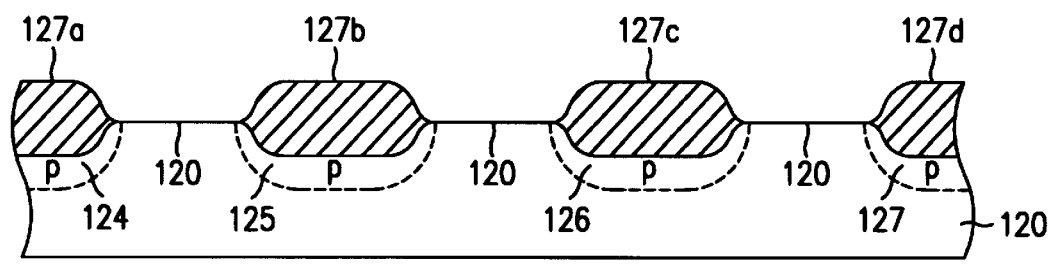

A plurality of p-type ion-implanted regions 124 to 127 are then separately formed in the p-type layer 120, which is subjected to field oxidation process as shown in FIG. 5. The field oxidation is achieved by performing a local oxidation of substrate (LOCOS) process or a Poly Buffered LOCOS (PBLOCOS) process. FIG. 5 illustrates a plurality of field oxide layers portions 127a to 127d which are formed to isolate the active regions 118 defined in the p-type layer 120 or substrate 100.

The nitride layer 122 and pad oxide layer 122 shown in FIG. 4 are removed by wet etching, which produces the cross sectional shape shown in FIG. 5. Also removed is the cap oxide layer which may be formed on the nitride layer 123, but which is not shown in the drawing. Subsequently, boron ions are implanted into the active regions 118 at 2.0E13 ions/cm² with about 30 KeV in order to adjust the threshold voltage of the cell transistor which will be subsequently formed.

Figure 6:
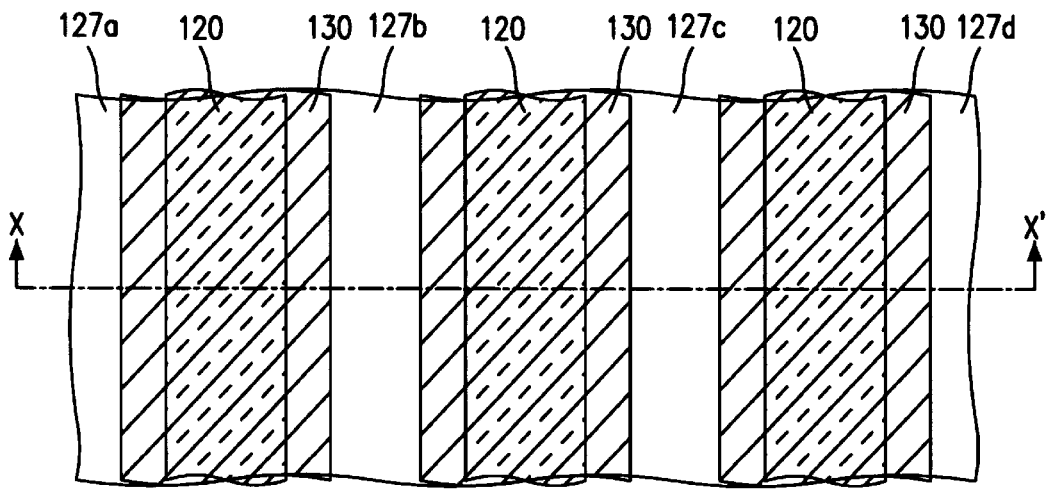
Figure 7:
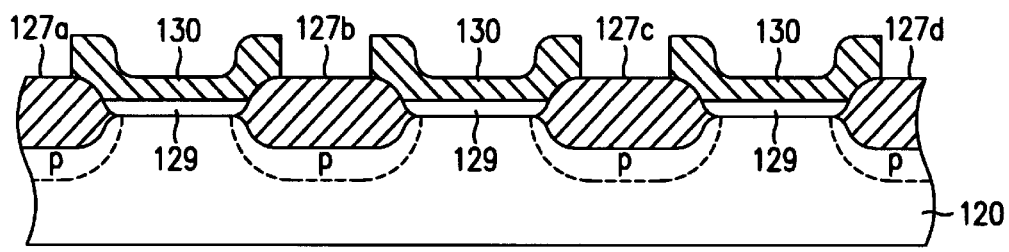

Referring now to FIGS. 6 and 7, an oxide layer 129 and a first polysilicon layer 130 are sequentially applied to the substrate. These layers are partially etched to expose parts of the field oxide layers 127a to 127d. FIG. 6 is a planar view for illustrating the arrangement of the active regions 118 and the first polysilicon layer 130. FIG. 7 is a cross-sectional view obtained along line X–X' shown in FIG. 6. For purposes of comparison with FIG. 2, one of the active regions 118 is omitted in FIG. 6 for the sake of convenience. The oxide layer 129 is formed to preferably have a thickness of about 100 A while the first polysilicon layer 130 is preferably formed by depositing a n-doped polysilicon with a thickness of about 1500 A. The first polysilicon layer 130 is patterned and etched to have form a pattern which extends over the active regions 120 to parts of the field oxide layers, as shown in FIG. 6.

Figure 8:
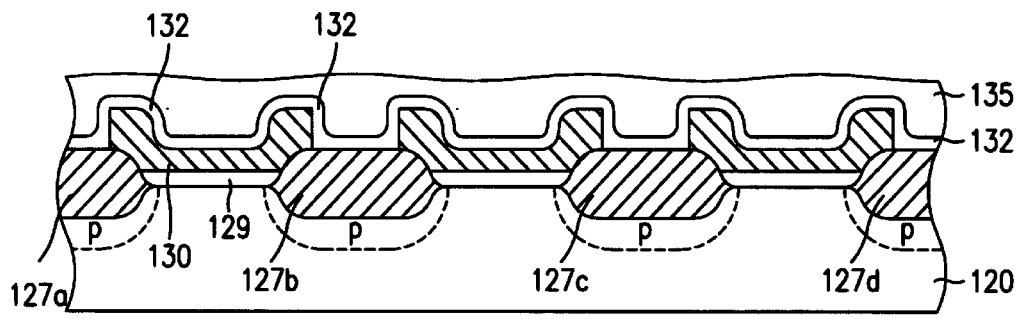

Subsequently, an insulating layer 132 and a second polysilicon layer 135 are sequentially deposited over the exposed field oxide layer and the first polysilicon layer, as shown in FIG. 8. The insulating layer 132 serves as an interpoly insulating layer, which may be constructed to have a triple composite structure, such as O/N/O, having thicknesses of 100 A/120 A/60 A, respectively. The second polysilicon layer 135 is used for the word line and the control gate and has a thickness of about 1500 A. The second polysilicon layer 135 is preferably made of a polycide, such as a composite layer consisting of a n-doped polysilicon layer with a thickness of about 1000 A, and a tungsten silicide, with a thickness of about 2000 A. The second polysilicon layer 135 is patterned to form the word lines, as shown in FIGS. 9 to 11.

Figure 9:
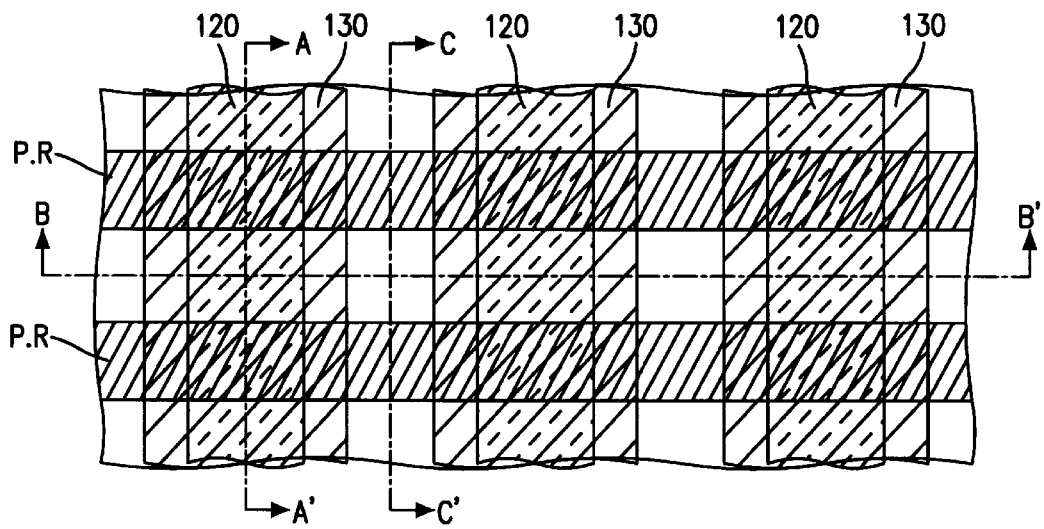

FIG. 9 illustrates the layout of parallel word lines W/L1 and W/L2 arranged perpendicularly to the active regions 118. FIG. 10 is a cross sectional view taken along line A–A' shown in FIG. 9. FIG. 11 is a cross sectional view taken along line C–C' of FIG. 9. The cross sectional view taken along B–B' of FIG. 9 is shown in FIG. 8.

Figure 10:
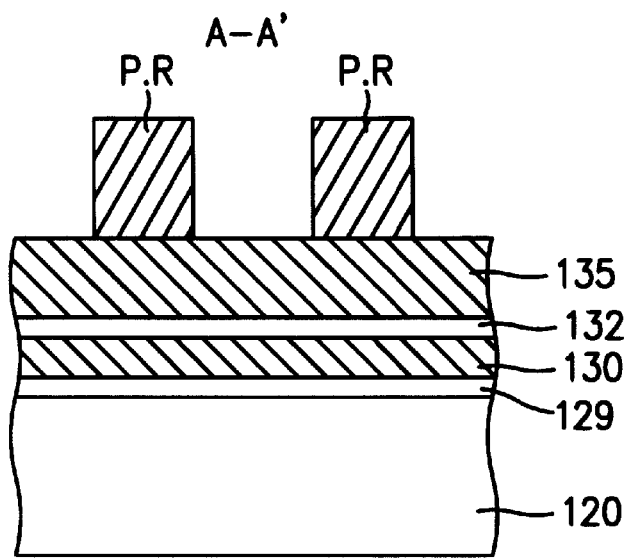
Figure 11:
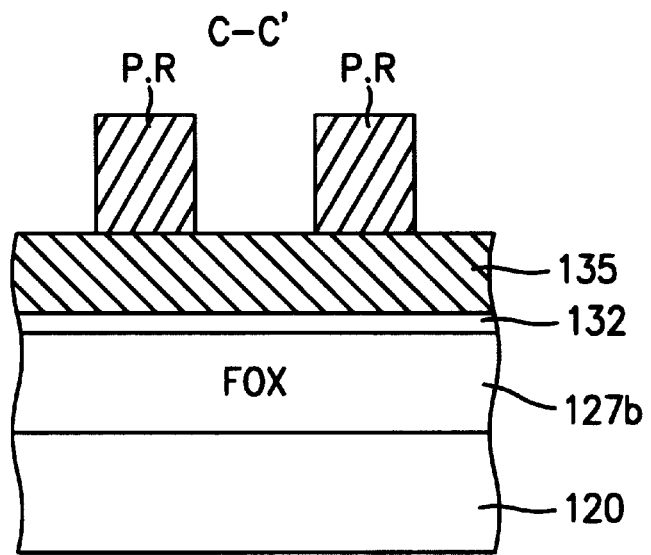
Figure 12:
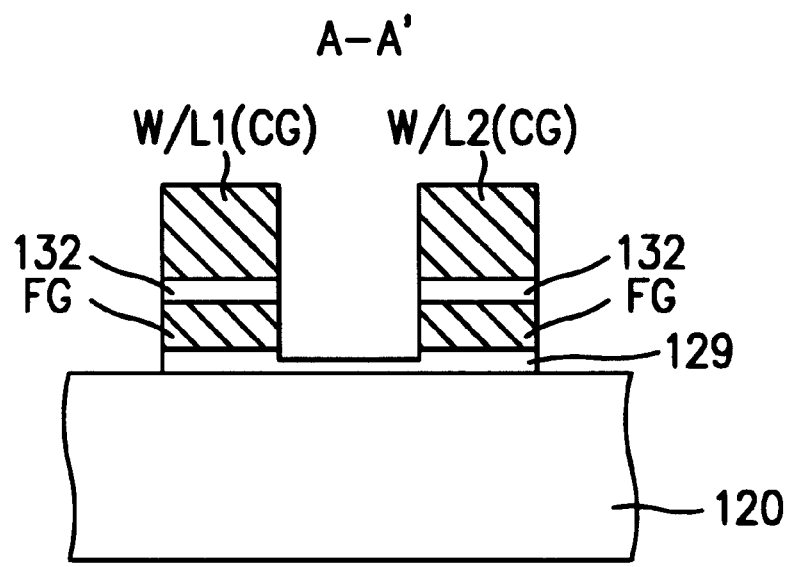
Figure 13:
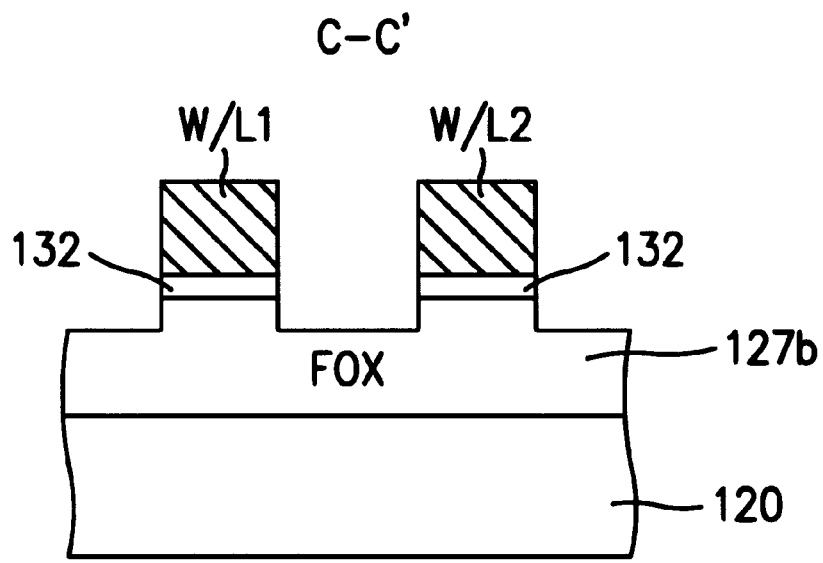

The photoresist pattern P.R obtained by photographic process, as shown in FIGS. 9 to 11, is used to form the word lines in the second polysilicon layer 135. According to the photoresist pattern, as shown in FIG. 9, the second polysilicon layer 135, insulating layer 132 and first polysilicon layer 130 are successively etched to form the floating gate FG and word lines W/L1 and W/L2. Once the photoresist is etched, then the etched cross sectional view of FIG. 12 is obtained from the pattern of FIG. 10 while the etched cross sectional view of FIG. 13 is obtained from the pattern of FIG. 11.

Figure 14:
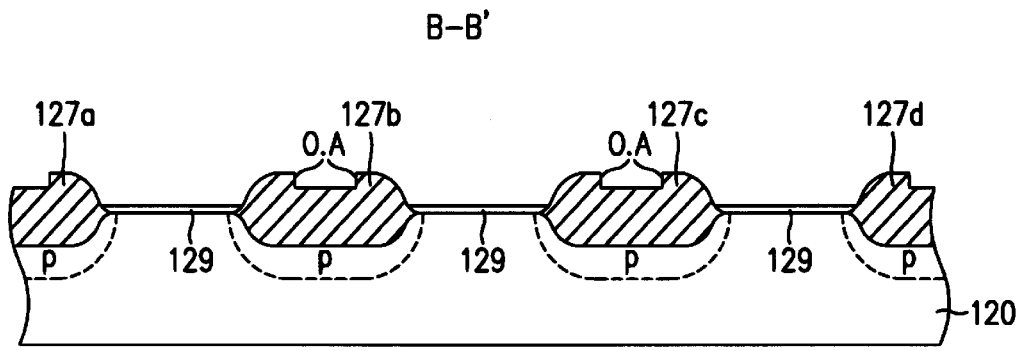

Referring now to FIG. 14, a cross sectional view is shown that is taken along line B–B' of FIG. 9 after the etching process. The field oxide layers 127a to 127d are partly overetched, as shown by reference symbol O.A, during etching of the second polysilicon 135 and insulating layer 132. Likewise, the oxide layer 129 is also overetched partly during etching of the first polysilicon layer 130. Once the etching process is completed, a stack gate structure is obtained which is so called because the control gate CG of the cell transistor is stacked over the floating gate FG. Thereafter, the oxide layer 129 is completely removed except for the part underlying the floaing gate FG. Then a photoresist pattern is photographically formed in order to perform ion implantation after etching, as shown in FIGS. 15 to 18.

Figure 15:
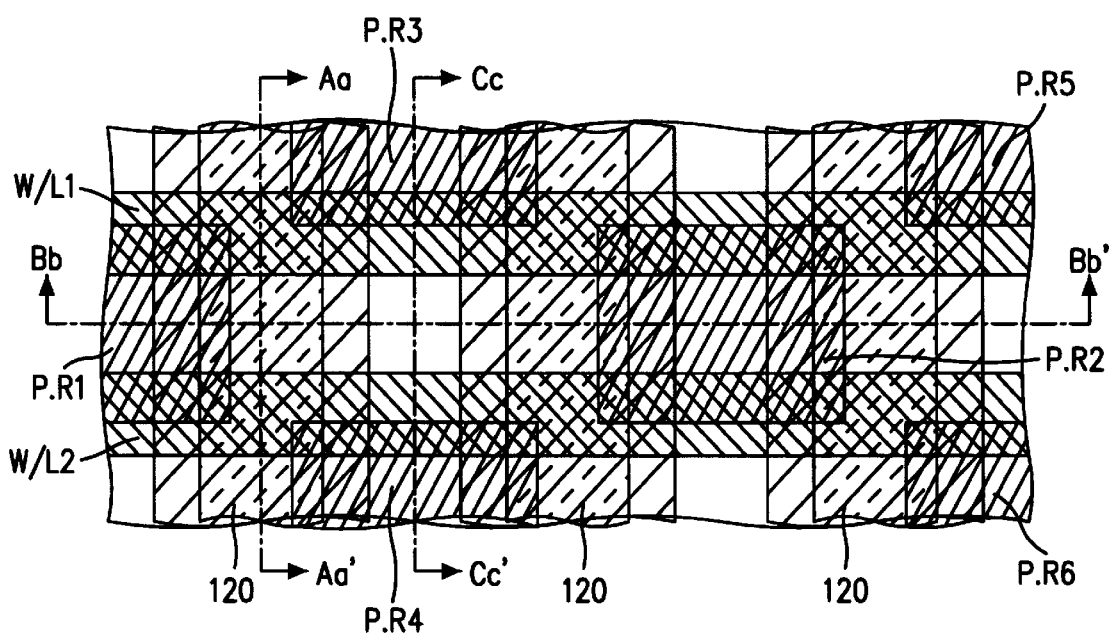

FIG. 15 illustrates a plurality of rectangular photoresist strips P.R1 to P.R6 arranged in a pattern selected to form the bit line contacts 20 and 21 and source line contacts 10–15 shown in FIGS. 2 and 3. The pattern exposes the field oxide layer between the adjacent word lines W/L1 and W/L2 and the adjacent active regions 118 in order to form openings for the bit line contacts 20 and 21 and the source line contacts 10 to 15. The field oxide layer that is exposed by the photoresist pattern P.R1–P.R6 and not covered by word lines W/L1 and W/L2 is then etched.

Figure 16:
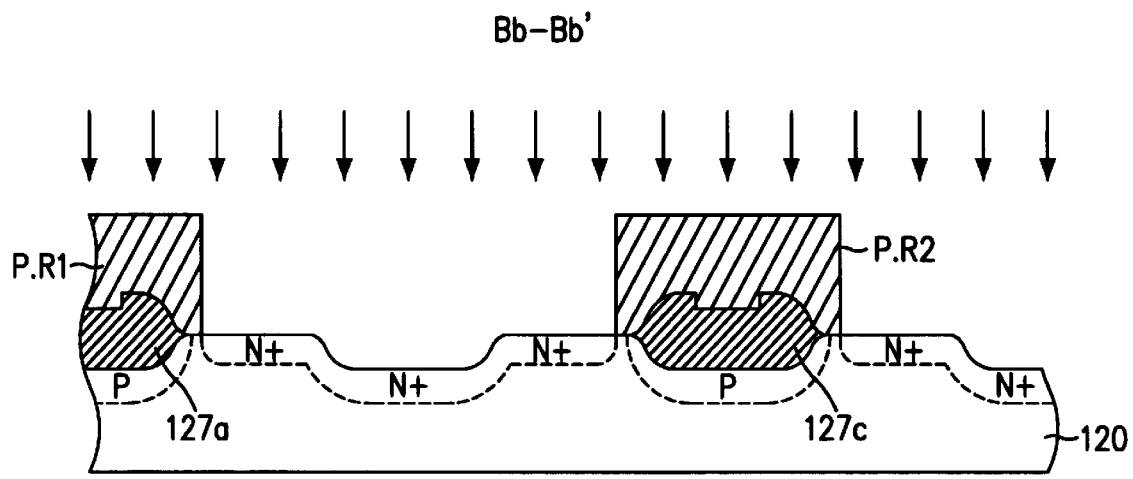

Referring now to FIG. 16, a cross sectional view taken along line Bb–Bb' of FIG. 15 is shown. The field oxide layers 127a and 127c are covered by the photoresist strips P.R1 and P.R2, respectively, but the field oxide layers 127b and 127d shown in FIG. 14 are removed. Thus, the field oxide layers are removed in an alternating pattern across the entire surface of the wafer. The regions obtained by etching the field oxide layers are subsequenty transformed into active regions.

Figure 17:
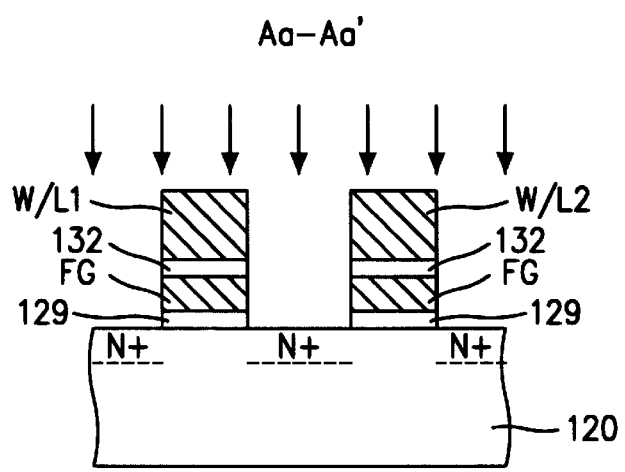
Figure 18:
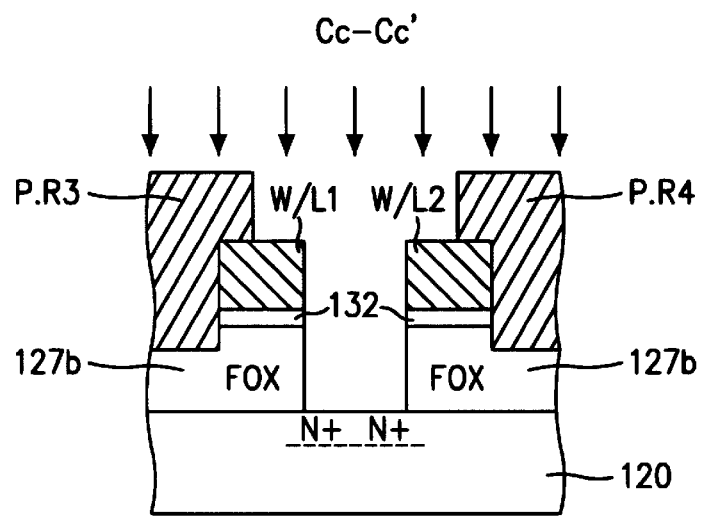

Next, impurity ions are implanted into the active regions for the drain and source using a photoresist paftem and the word lines as mask. FIG. 17 is a cross sectional view of FIG. 15 taken along line Aa–Aa' which illustrates word lines W/L1 and W/L2 functioning as a mask FIG. 18 is a cross sectional view of FIG. 15 taken along line Cc–Cc' which illustrates the photoresist strips P.R3 and P.R4 and the field oxide layer 127b divided into two parts.

Referring now to FIG. 17, the ion-implanted active region 118 between the stack gate structure serves as the common drain region for two adjacent cells while both edge portions serve as source regions. In this case, it is preferable to implant arsenic ions into the drain region with 50 KeV at 5.0E15 ions/cm$^2$ or n-type phosphorous ions with 40 KeV at 2.0E13 ions/cm$^2$.

After the ion-implantation is performed, the photoresist pattern P.R1–R.R6 is removed and the upper surface is wholly covered with an intermediate insulating layer 140. The intermediate insulating layer 140 is then partially etched to expose the ion-implanted region and simultaneously form the bit line contact holes 20 and the source line contact holes 10–15. The insulating layer 140 is preferably obtained by sequentially depositing an oxide layer and a BPSG layer and heating it at 900° C. for 10 minutes in order to obtain a smooth flat layer.

Figure 19:
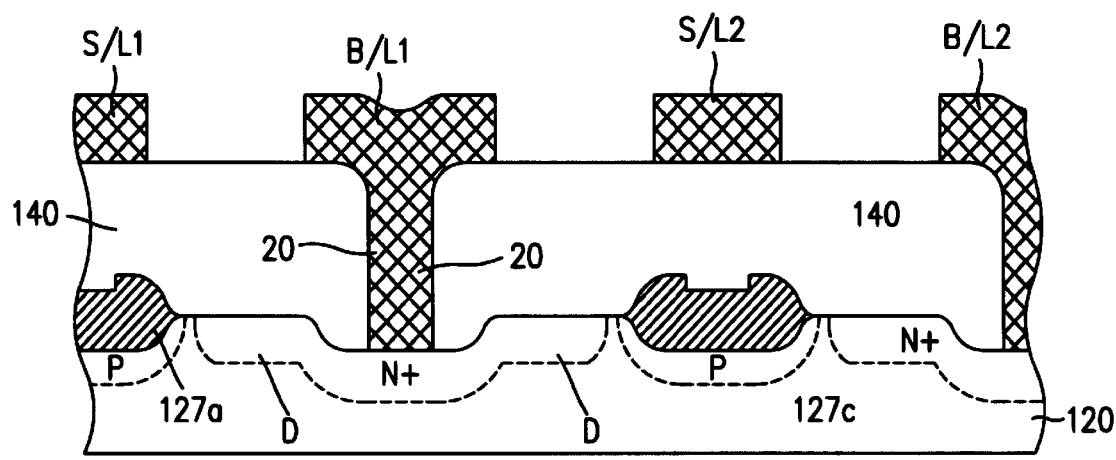
Figure 20:
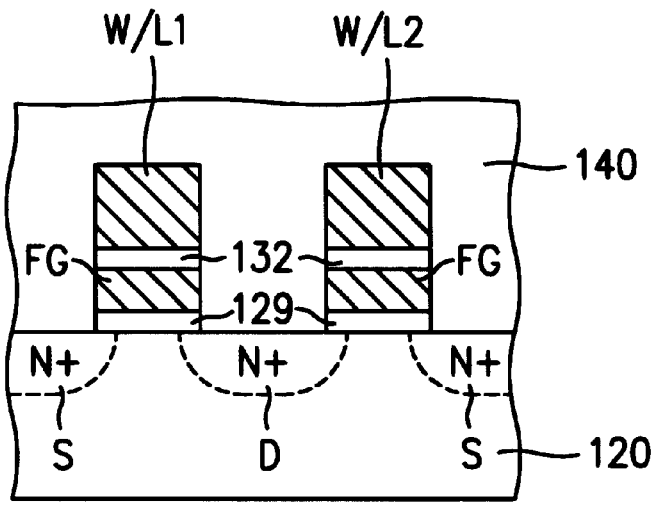
Figure 21:
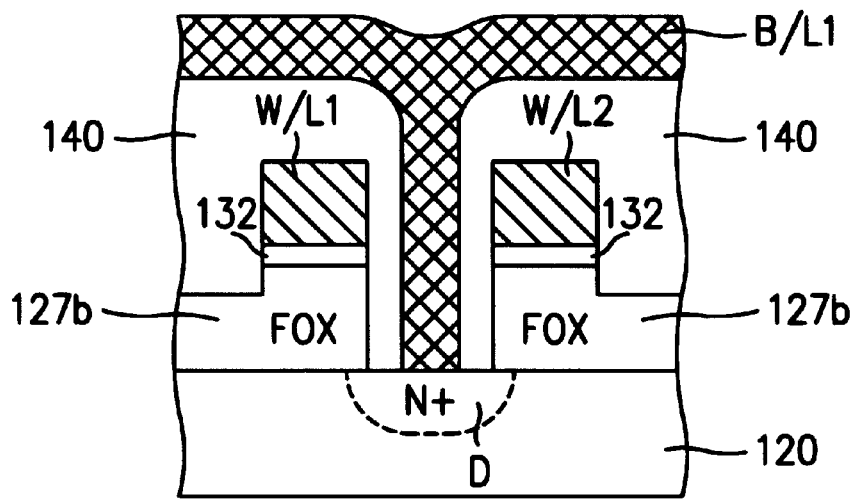

A metal pattern is then formed on the intermediate insulating layer 140 with the resulting structure shown in FIG. 19. The metal pattern includes the bit lines B/L1 and B/L2 and the source lines S/L1 and S/L2 which are formed on the intermediate insulating layer 140 in order to contact the common drain regions D and the source regions S. Thus, the drain regions D of the adjacent cell transistors commonly connected to the adjacent word line W/L1 are connected to the bit line B/L1 through contact hole 20. The drain regions D of the adjacent cell transistors that are commonly connected to the other word line W/L2 are also connected to bit line B/L1 through contact hole 20.

However, the source regions S of the adjacent cell transistors which are commonly connected to each of the word lines W/L1 and W/L2 are separately connected to different source lines S/L1 and S/L2. This is more dearly illustrated in the layout of FIG. 2 and the equivalent circuit of FIG. 3.

The circuit structure and process discussed above is just one possible embodiment of the present invention. Alternatively, the source and drain junctions of the cell transistor may have the same or different structure, and a CMOS procedure may be employed to fabricate both NMOS and PMOS transistors in order to simultaneously form the circuits peripheral to the cells. Furthermore, the drain may have an LDD or DD structure and the source may be formed with a deep n+junction. In addition, the bit and the source lines may be used in a manner opposite from that discussed above during either the programming or reading operations.

The present invention provides for reducing the size of the cell array and the source resistance in programming and reading, thus resulting in high degree of integration and improved operational reliability. While the present invention has been illustrated and described with reference to specific embodiments thereof, further modifications and alterations will occur to those skilled in the art which remain within the spirit and scope of the present invention.

What is claimed is:

1. A process for fabricating a nonvolatile semiconductor memory cell array having a plurality of unit cell-arrays repeatedly arranged, each of said unit cell-arrays including two adjacent word lines each commonly occupied by control gates of a plurality of cell transistors, a bit line connected with drains of four adjacent cell transistors of both word lines through a bit line contact, a pair of source lines respectively arranged in parallel at both sides of said bit line, and sources of the two adjacent cell transistors of each of both word lines respectively connected with different ones of said source lines through different source line contacts, the method comprising the steps of:

forming a stack gate structure of each of the plurality of cell transistors by stacking a floating gate and one of the word lines over an active region between a pair from a plurality of field oxide layers on a semiconductor substrate, said floating gate and word line being surrounded by insulating layers;

exposing alternate ones of said plurality of field oxide layers in order to remove the exposed oxide layers;

implanting impurity ions for the drain and source of each one of the plurality of cell transistors into the regions cleared of said exposed oxide layers in order to obtain the bit and source line contacts, wherein the bit line contact is adjacent to each of the diains of the four adjacent cell transistors, and a different source line contact is adjacent to each of sources of the four adjacent cell transistors;

applying an intermediate insulating layer to an upper surface of said substrate;

etching said intermediate insulating layer to expose the ion-implanted regions so as to form the bit and source line contact holes; and performing metallization to obtain the bit and source lines.

2. A process for fabricating a nonvolatile memory cell array, comprising the steps of:

forming a plurality of field oxide layers so as to isolate active regions defined in a semiconductor substrate;

sequentially depositing a tunnel oxide layer and a first silicon layer for floating gates over said semiconductor substrate;

partially etching said first silicon layer and tunnel oxide layer to expose parts of said field oxide layers;

sequentially depositing an insulating layer and a second silicon layer for the word lines over said substrate to make a pattern of the word lines parallel with each other and perpendicular to said active regions;

etching said second silicon layer, insulating layer and first silicon layer except said word line pattern to form said floating gates and word lines;

forming an alternate etching pattern to alternately expose said field oxide layers between said word lines and said active regions;

removing the exposed field oxide layers to implant impurity ions for the drain and sources by using said alternate etching pattern and said word lines as a mask;

applying an intermediate insulating layer so as to expose the ion-implanted regions so as to simultaneously form bit line and source line contact holes; and forming metal lines over said intermediate insulating layer so as to contact said drain and source regions through said contact holes, whereby the drain regions of the adjacent cell transistors of the adjacent word lines are commonly connected with a bit line through a contact hole and the source regions of the adjacent cell transistors of each of said adjacent word lines are separately connected with different source lines through different contact holes.

3. A process for fabricating a NOR-type memory cell array, comprising the steps of:

forming a plurality of field oxide layers so as to isolate active regions defined in a semiconductor substrate;

sequentially depositing a tunnel oxide layer and a first silicon layer for floating gates over said semiconductor substrate;

partially etching said first silicon layer and tunnel oxide layer to expose parts of said field oxide layers;

sequentially depositing a composite insulating layer, to serve as a gate insulator, and a second silicon layer, to serve both word lines and control gates, over said substrate to form a pattern where the word lines are parallel with each other and perpendicular to said active regions;

etching said second silicon layer, composite insulating layer and first silicon layer except said word line pattern in order to form said floating gates and word lines;

forming an alternate etching pattern to alternately expose said field oxide layers between said word lines and said active regions;

removing the exposed field oxide layers and implanting impurity ions to form drains and sources by using said alternate etching pattern and said word lines as a mask;

applying an intermediate insulating layer to an upper surface of said substrate;

partially etching said intermediate insulating layer so as to expose the ion-implanted regions so as to simultaneously form bit line contact holes and source line contact holes; and forming metal lines of said intermediate insulating layer so as to contact said drain and source regions through said contact holes, whereby every bit line has a bit line contact hole for commonly connecting drain regions of four adjacent transistors and the source line parallel and adjacent to the bit line has two source line contact holes each commonly connecting to source regions of two of the four adjacent transistors.

4. A method for forming an electrically erasable memory cell array, the method comprising:

forming a first plurality of cell transistors, each one of the first plurality of cell transistors having a control gate, floating gate, source and drain, where the first plurality of cell transistors is disposed linearly along a first line;

forming a second plurality of cell transistors, each one of the second plurality of cell transistors having a control gate, floating gate, source and drain, where the second plurality of cell transistors is disposed linearly along a second line that is parallel to the first line;

forming a first word line along the first line and coupling the first word line to the control gate of each one of the first plurality of cell transistors;

forming a second word line along the second line and coupling the second word line to the control gate of each one of the second plurality of cell transistors;

forming a bit line perpendicular to the first and second word lines and coupling the bit line to the drains of each cell transistor of the first and second pluralities of cell transistors through a bit line contact, wherein each cell transistor of the first and second pluralities of cell transistors is adjacent to the bit line contact;

forming a first source line adjacent to a first side of the bit line and coupling the first source line to the source of one cell transistor of the first plurality of cell transistors through a first adjacent source contact and coupling the first source line to the source of one cell transistor of the second plurality of cell transistors through a second adjacent source contact; and forming a second source line adjacent to a second side of the bit line and coupling the second source line to the source of another cell transistor of the second plurality of cell transistors through a third adjacent source contact and coupling the second source line to the source of another cell transistor of the second plurality of cell transistors through a fourth adjacent source contact.

5. The method of claim 4, wherein each cell transistor of the first plurality of cell transistors shares its drain with a corresponding cell transistor of the second plurality of cell transistors.

6. The electrically erasable memory cell array produced by the method of claim 4.

7. The method of claim 4, wherein forming a bit line comprises forming a metallic line.

8. The method of claim 4, wherein forming the first and second source lines comprises forming first and second metallic source lines.

9. The method of claim 3, wherein:

the source line is a first source line; and a second source line parallel and adjacent to the bit line has two source line contact holes each commonly connecting to source regions of the other two of the four adjacent transistors.

10. A process for fabricating a nonvolatile memory cell array comprising:

forming first, second, and third parallel field oxide regions to isolate first and second parallel active regions in a semiconductor substrate;

forming a tunnel insulating layer and a floating gate layer over the first and second active regions;

forming a second insulating layer and a control gate layer over the floating gate layer and the first, second, and third field oxide regions;

etching the control gate layer, the second insulating layer, the floating gate layer, and the tunnel insulating layer to form floating gates over the first and second active regions, and to form first and second word lines perpendicular to the active regions and the field oxide regions;

removing a common drain region of the second field oxide region between the first and second word lines;

removing first and second common source regions of each of the first and third field oxide regions which are not between the first and second word lines;

implanting impurities into the common drain region and the common source regions;

forming an intermediate insulating layer so as to form contact holes over the common drain region and the common source regions;

coupling bit and source lines to the common drain region and the common source regions through the contact holes.

11. The process of claim 10, wherein coupling bit and source lines to the common drain region and the common source regions comprises:

forming a bit line over the intermediate insulating layer so as to contact the common drain region; and forming a first source line over the intermediate insulating layer so as to contact a first two of the common source regions.

12. The process of claim 11, wherein coupling bit and source lines to the common drain region and the common source regions further comprises:

forming a second source line over the intermediate insulating layer so as to contact a second two of the common source regions.

13. The process of claim 12, wherein:

the first source line contacts the first and second common source regions of the first field oxide region; and the second source line contacts the first and second common source regions of the second field oxide region.

14. The process of claim 12, wherein the bit line and first and second source lines are parallel to the field oxide regions.

15. The process of claim 14, wherein the bit line and first and second source lines are located over the field oxide regions.

16. A nonvolatile semiconductor memory cell array fabricated according to the process of claim 1.

17. A nonvolatile memory cell array fabricated according to the process of claim 2.

18. A NOR-type memory cell array fabricated according to the process of claim 3.

* * * * *

UNITED STATES PATENT AND TRADEMARK OFFICE
CERTIFICATE OF CORRECTION

PATENT NO.   : 6,312,990 B1                                                     Page 1 of 1
DATED        : November 6, 2001
INVENTOR(S)  : Kim et al.

It is certified that error appears in the above-identified patent and that said Letters Patent is hereby corrected as shown below:

Column 1,
Line 16, "Nonvolable" should read -- Nonvolatile --.

Column 3,
Line 62, "Nonvolable" should read -- Nonvolatile --.

Column 4,
Line 51, "from bit line" should read -- form bit line --.

Column 10,
Line 58, "floaing" should read -- floating --.

Column 11,
Line 15, "paftern" should read -- pattern --.
Line 55, "dearly" should read -- clearly --.
Line 59, "Altematively," should read -- Alternatively, --.

Column 12,
Line 34, "diains" should read -- drains --.

Column 14,
Line 33, "metallic line" should read -- metallic bit line --.

Signed and Sealed this

Twelfth Day of November, 2002

*Attest:*

*Attesting Officer*

JAMES E. ROGAN
*Director of the United States Patent and Trademark Office*